(12) United States Patent
Chilcott et al.

(10) Patent No.: US 6,750,521 B1
(45) Date of Patent: Jun. 15, 2004

(54) SURFACE MOUNT PACKAGE FOR A MICROMACHINED DEVICE

(75) Inventors: Dan W. Chilcott, Greentown, IN (US); Hamid Reza Borzabadi, Noblesville, IN (US); Douglas Ray Sparks, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/422,723

(22) Filed: Oct. 22, 1999

(51) Int. Cl.⁷ .............................................. H01L 29/84
(52) U.S. Cl. ...................................................... 257/414
(58) Field of Search .................................. 215/414, 415, 215/416, 417, 418, 419, 420

(56) References Cited

U.S. PATENT DOCUMENTS

| | | | |
|---|---|---|---|
| 4,551,747 A | * 11/1985 | Gilbert et al. | |
| 4,890,194 A | * 12/1989 | Derryberry et al. | |
| 5,002,901 A | * 3/1991 | Kurtz et al. | |
| 5,426,566 A | * 6/1995 | Beilstein, Jr. et al. | |
| 5,706,565 A | 1/1998 | Sparks et al. | 29/25.42 |
| 5,831,162 A | 11/1998 | Sparks et al. | 73/504.12 |
| 6,225,692 B1 | * 5/2001 | Hinds | |
| 6,251,501 B1 | 6/2001 | Higdon et al. | |
| 6,259,608 B1 | 7/2001 | Berardinelli et al. | |
| 6,275,513 B1 | * 8/2001 | Chang-Hasnain et al. | |
| 6,297,072 B1 | * 10/2001 | Tilmans et al. | |
| 6,421,249 B1 | 7/2002 | Trombley et al. | |
| 6,531,664 B1 | 3/2003 | Otto et al. | |

OTHER PUBLICATIONS

Streetman, "Solid State Electronics," 1990, Prentice Hall, third edition, p. 371–372.*
Wolf, "Silicon Processing for the VLSI Era—vol. 2: Process Integration," 1990, Lattice Press, vol. 2, p. 180–181, and 189.*
U.S. patent application Ser. No. 09/116,815, Sparks et al., filed Jun. 3, 1998.

* cited by examiner

*Primary Examiner*—Nathan J. Flynn
*Assistant Examiner*—Kevin Quinto
(74) *Attorney, Agent, or Firm*—Stefan V. Chmielewski

(57) ABSTRACT

A semiconductor device and method by which a device chip with a micromachine is directly surface mounted to a circuit board. A capping chip is bonded to the device chip and encloses the micromachine. The capping chip has a first surface facing the device chip, an oppositely-disposed second surface, and electrical interconnects through the capping chip between the first and second surfaces. The electrical interconnects electrically communicate with runners on the device chip that are electrically connected to the micromachine, thereby providing a signal path from the micromachine to the exterior of the device. The capping chip further includes bond pads for electrical communication with the electrical interconnects. With the bond pads, the capping chip can be surface mounted to a circuit board by reflowing solder bumps formed on the bond pads. Depending on the placement of the bond pads on the capping chip, the semiconductor device can be mounted to the circuit board with the capping chip between the device chip and circuit board, or the semiconductor device can be mounted with one side of the device attached to the circuit board.

25 Claims, 3 Drawing Sheets

SURFACE MOUNT PACKAGE FOR A MICROMACHINED DEVICE

TECHNICAL FIELD

The present invention generally relates to surface mount electronic devices. More particularly, this invention relates to a semiconductor device having a micromachine and capable of being surface mounted as a package to a circuit board.

BACKGROUND OF THE INVENTION

A variety of semiconductor micromachines are known, including yaw (angular rate) sensors, angular and linear accelerometers, pressure sensors, thermal sensors, and actuators such as nozzles and valves. Each of these devices typically involves one or more micromachined structures (micromachines) formed in or on a silicon chip (referred to herein as a device chip). The device chip is often placed within a protective subpackage and then wire bonded to electrically connect the device to bond pads on the subpackage. The bond pads of the subpackage can then be reflow soldered to conductors on a circuit board, electrically and physically interconnecting the device to the board circuitry. Alternatively, device chips can be glued to a ceramic substrate, and then wire bonded to a circuit board after other surface mount components have been reflow soldered to the board.

Another packaging alternative involves wafer bonding methods, in which the micromachine of a device chip is enclosed by a second chip (referred to herein as a capping chip), which is bonded to the device chip. A cavity is often formed in the capping chip to receive and/or provide clearance for the micromachine of the device chip. Absolute pressure sensors require that the cavity be evacuated and hermetically sealed, while the performance of yaw sensors and accelerometers with resonating and tunneling micromachines generally benefit if the cavity is evacuated so that the micromachine operates in a vacuum. Bonding is typically achieved by forming the capping chip of silicon or glass (e.g., Pyrex), which can be bonded to the silicon device chip by such known techniques as anodic bonding and silicon fusion bonding, or with the use of glass frit, adhesives and solder. An example of this method is represented in FIG. 1, in which a micromachine sensor 110 is shown to include a device chip 112 with a surface micromachine 114, and a capping chip 116 with a cavity 118 in which the micromachine 114 is received. A portion of the capping chip 116 is removed by cutting or etching to allow for wire bonding of bond pads 120 on the device chip 112 to a ceramic substrate (not shown) to which the sensor 110 is attached by glueing or another suitable method. The substrate is then placed in a cavity package and mounted to a circuit board.

From the above, it can be appreciated that semiconductor micromachines have required various packaging and bonding steps that add significant cost. Accordingly, it would be desirable if semiconductor micromachines could be produced and packaged with reduced material and processing requirements, yet were produced in a form that protects the delicate micromachine from potential hazards within its operating environment.

SUMMARY OF THE INVENTION

The present invention is directed to a semiconductor device and method by which a device chip with a micromachine is directly surface mounted to a circuit board. Semiconductor devices in accordance with this invention generally entail a device chip with a micromachine and electrically-conductive runners that electrically connect the micromachine to appropriate signal conditioning circuitry. A capping chip is bonded to the device chip and encloses the micromachine. The capping chip has a first surface facing the device chip, an oppositely-disposed second surface, and electrical interconnects through the capping chip between the first and second surfaces. The electrical interconnects electrically communicate with the runners on the device chip, thereby providing a signal path from the micromachine to the exterior of the device. The capping chip further includes bond pads in electrical communication with the electrical interconnects. With the bond pads, the capping chip can be surface mounted to a circuit board by reflowing solder bumps formed on the bond pads. Depending on the placement of the bond pads on the capping chip, the semiconductor device can be mounted to the circuit board with the capping chip between the device chip and circuit board, or the semiconductor device can be mounted with one side of the device attached to the circuit board.

The method of this invention generally entails forming the device and capping chips in accordance with the above, and then bonding the capping chip to the device chip so as to enclose the micromachine within the semiconductor device and electrically connect the micromachine to the bond pads on the exterior of the capping chip. Bonding is preferably performed with solder bumps formed on the capping chip. The solder bumps are located on the capping chip so as to register with the runners on the device chip when the capping and device chips are mated. Reflowing causes the solder bumps to form solder connections that physically interconnect the runners to the electrical interconnects, and thereby electrically interconnect the micromachine to the bond pads of the semiconductor device.

In view of the above, a semiconductor device with a micromachine element can be manufactured and surface mounted to a circuit board without the additional steps of wire and adhesive bonding, without a chip for the sole purpose of enclosing the micromachine, and without a subpackage or cavity package to protect the micromachine.

Other objects and advantages of this invention will be better appreciated from the following detailed description.

DESCRIPTION OF THE PREFERRED EMBODIMENT

FIGS. 2 through 6 illustrate examples of semiconductor devices that can be fabricated and surface mounted in accordance with this invention. Each device is shown as being formed by solder bonding a device chip to a capping chip, such that a micromachine is protected in some manner by the capping chip, e.g., a micromachine is formed on the device chip and enclosed within a cavity formed by a recess in the capping chip. As evidenced from the Figures, the micromachine can have a variety of transduction configurations, including that of an actuator or a sensing element for motion, pressure, heat, light or chemical sensing. The device chips are preferably silicon, more preferably monocrystallographic silicon, though it is foreseeable that other materials could be used. The capping chips can be formed of ceramic, glass, silicon or another semiconducting material through which electrically conductive interconnects can be formed. Suitable ceramic materials include low temperature cofired ceramic (LTCC), high temperature cofired ceramic (HTCC), thick film ceramic with punched vias, thick or thin film on glass (e.g., Pyrex, etc.) or ceramic with machined vias. To better match the expansion coefficients of a ceramic capping chip with a silicon device chip, the composition of the ceramic can be modified with the addition of Pyrex or a glass frit mixed into the ceramic prior to green sheet fabrication. By matching the expansion coefficient of the device and capping chips, a more stable and durable device is produced.

Figure 1:
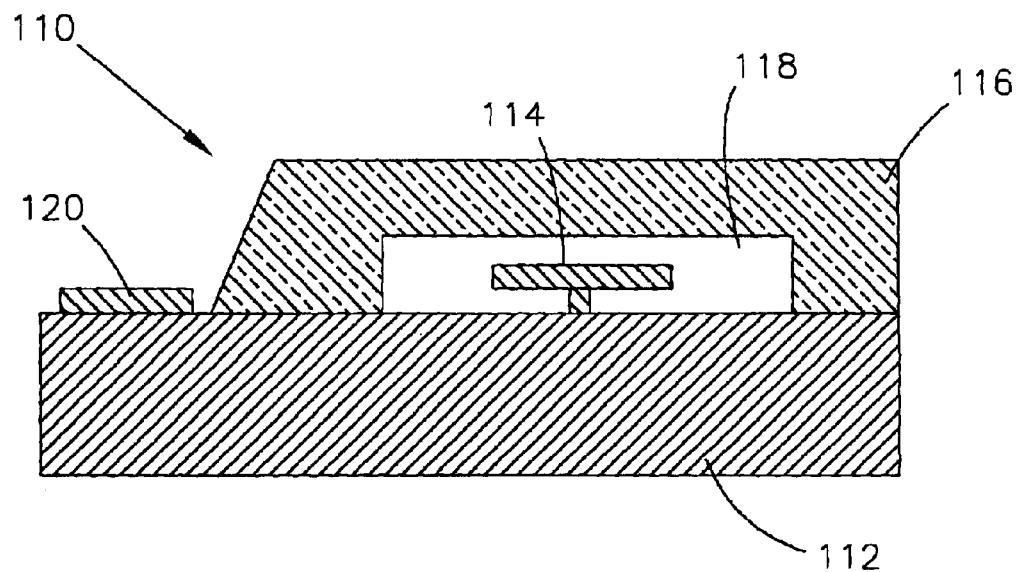
FIGS. 1 is a cross-sectional view of a wafer-bonded semiconductor micromachine sensor in accordance with the prior art.
Figure 2:
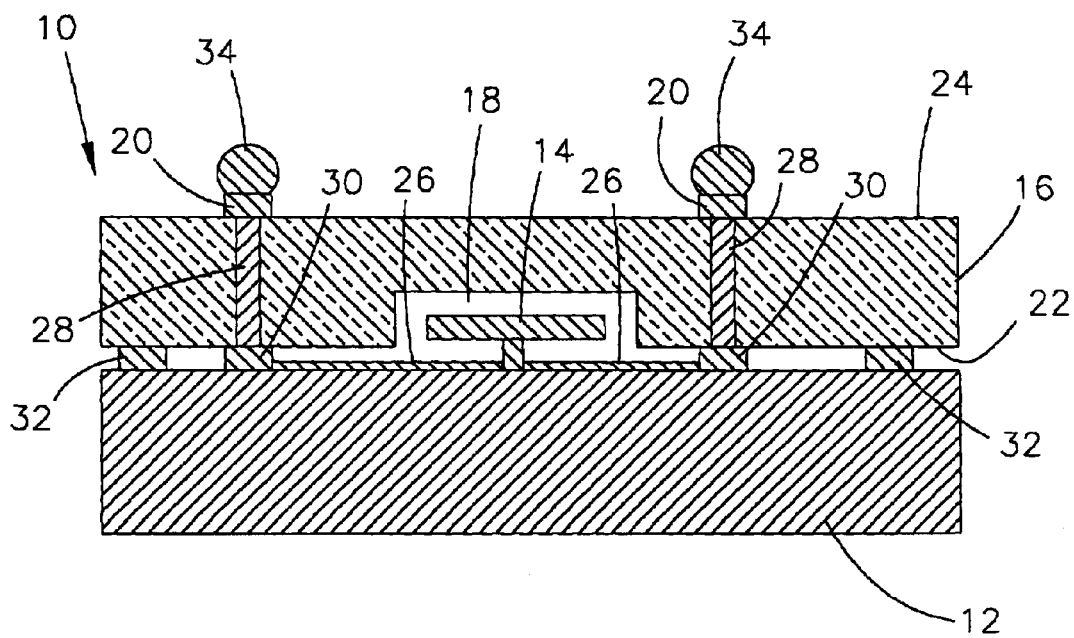
FIG. 2 is a cross-sectional view of a wafer-bonded semiconductor micromachine sensor in accordance with a first embodiment of the present invention.

Referring to FIG. 2, a semiconductor sensing device 10 is shown with a device chip 12 solder bonded to a capping chip 16. A micromachine 14 formed on the device chip 12 is enclosed within a cavity 18 formed by a recess in a lower surface 22 of the capping chip 16. The recess can be fabricated during the green tape portion of LTCC or HTCC fabrication, or formed by machining or etching after the material for the capping chip 16 is fired. As depicted, the micromachine 14 may be a resonating micromachine of a type used to sense motion, such as angular rate sensors for monitoring yaw, pitch or roll, angular and linear acceleration, and vibration sensors, as disclosed in U.S. Pat. No. 5,831,162 to Sparks et al., commonly assigned with this invention. Other types of sensing micromachines are also possible with the general configuration shown in FIG. 2, including but not limited to micromachined cantilevers for sensing motion. As known in the art, capacitive or piezoresistive sensing elements (not shown) can be used to sense motion of the micromachine 14.

The micromachine 14 is shown as being electrically interconnected to bond pads 20 on the capping chip 16 by conductive runners 26 on the enclosed surface of the device chip 12 and by metal vias 28 through the thickness of the capping chip 16, i.e., between the lower surface 22 and the upper surface 24 of the capping chip 16. The runners 26 and metal vias 28 can be formed by any suitable method. As an example, the vias 28 may be formed during the green tape portion of LTCC or HTCC fabrication of the capping chip 16. Alternatively, if the chip 16 is formed of thick-film ceramic, the vias 28 can be produced by punching or machining the chip 16, and then filling with a suitable conductor material. With the bond pads 20, the micromachine 14 and its corresponding sensing elements can be electrically interconnected with circuitry on a substrate to which the device 10 is mounted, as will be discussed in reference to FIGS. 3 and 4 below. Signal conditioning circuitry for the sensing elements can be formed on the device or capping chips 12 or 16.

As shown in FIG. 2. in a preferred embodiment of the invention, the metal vias 28 are physically and electrically connected to the runners 26 with solder connections 30 within the cavity 18, and the capping chip 16 is attached to the device chip 12 with a solder seal ring 32 that surrounds the cavity 18 and the solder connections 30, so that the solder connections 30 as well as micromachine 14 are protectively enclosed between the chips 12 and 16. The chips 12 and 16 can be solder bonded in a vacuum with the seal ring 32, with the result that the micromachine 14 is hermetically vacuum sealed within the cavity 18 to enhance the performance of the micromachine 14 if operated as a resonating or tunneling element of a yaw sensor or accelerometer. If a hermetic seal is not required, the seal ring 32 need not be continuous or even a ring. The solder bonding process by which the ring 32 bonds the chips 12 and 16 entails depositing a suitable solder composition on solderable regions of the device and capping chips 12 and 16. These solderable regions are necessary as solder will not wet or metallurgically bond to the substrates of the chips 12 and 16. A suitable process and materials for the solderable regions are disclosed in U.S. Pat. No. 6,062,461 to Sparks et al., commonly assigned with this invention.

Figure 3:
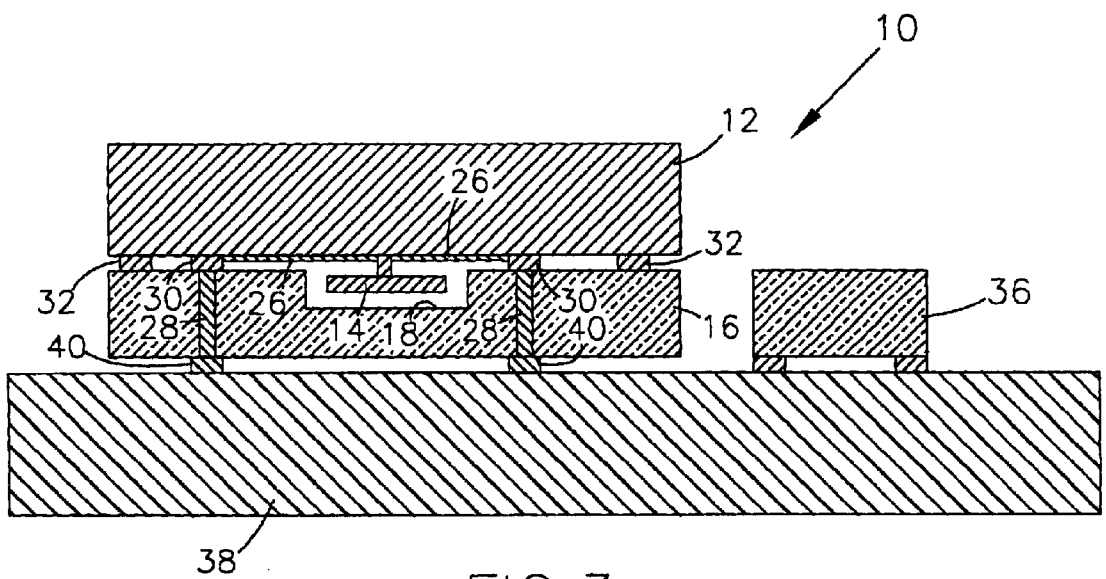
FIG. 3 is a cross-sectional view of the sensor of FIG. 2 surface mounted to a circuit board in accordance with a method of this invention.
Figure 4:
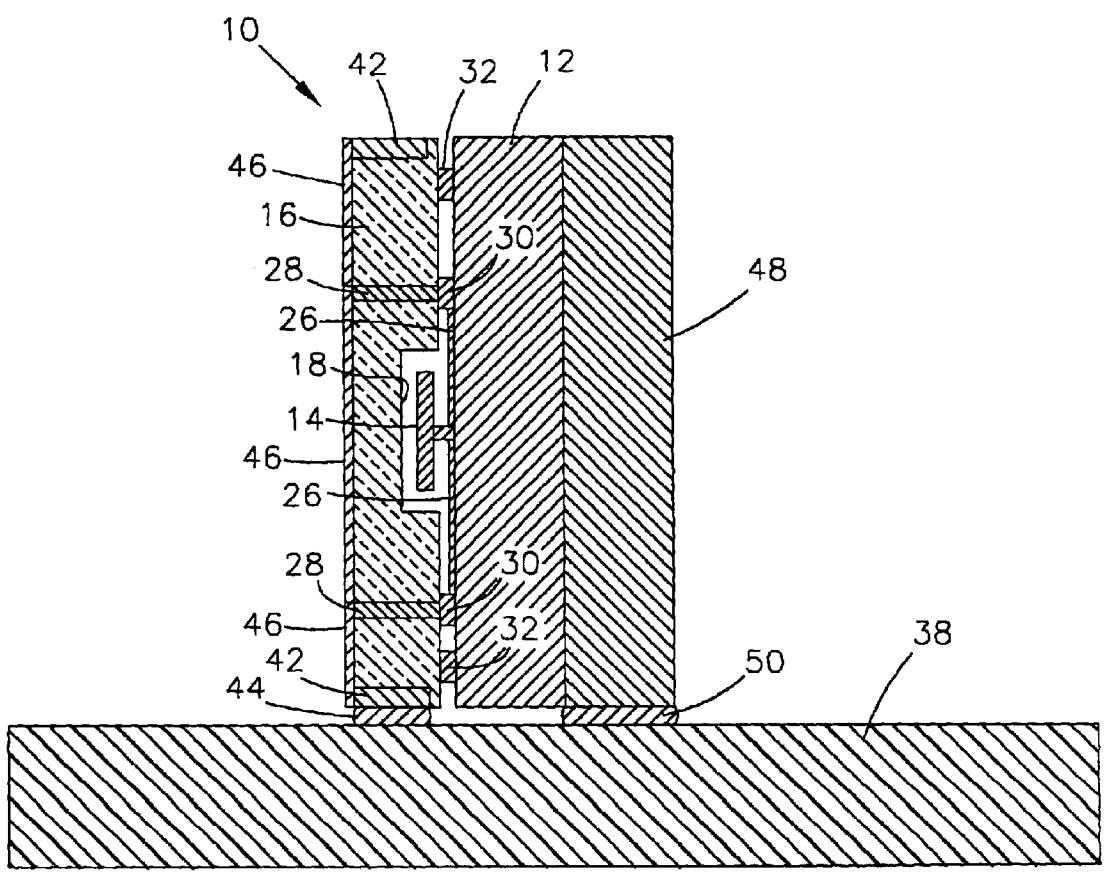
FIG. 4 is a cross-sectional view of the sensor of FIG. 2 that has been surface mounted to a circuit board in accordance with an alternative method of this invention.

Finally, solder bumps 34 are shown as being located on the bond pads 20, allowing for the device 10 to be "flip-chip" mounted to an appropriate substrate, as depicted in FIGS. 3 and 4. In order to avoid remelting the solder connections 30 and seal ring 32 during solder bonding of the device 10, the solder compositions for the solder connections 30 and seal ring 32 preferably have a higher melting or liquidus temperature than that of the solder bumps 34. The device 10 can then be placed on a circuit board and reflowed along with other surface-mount components. In FIG. 3, the device 10 is shown placed next to a conventional surface-mount component 36 on a circuit board 38 of any suitable construction. The solder bumps 34 on the capping chip 16 are shown as having been reflowed to form solder connections 40 that physically and electrical connect the device 10 to the board 38, so that the capping chip 16 is between the device chip 12 and the board 38.

In FIG. 4, an alternative mounting orientation for the device 10 is shown, by which a side or the device 10 is attached to the circuit board 38. By mounting the device 10 as depicted in FIG. 4, the device 10 can be oriented to respond in any axis (x, y or z) of motion. This embodiment of the invention is preferably achieved by forming wide electrical vias in the saw street of the wafer material from which the capping chip 14 is cut. The resulting metal regions 42 (one of which is shown in FIG. 4) can be plated with solder or a solderable material, and then joined with solder 44 to the circuit board 38, so that the metal regions 42 are between the capping chip 16 and the board 38. The metal regions 42 preferably do not contact the device chip 12 because the body of the chip 12 is typically at electrical ground. Conductive runners 46 arc shown on the surface of the capping chip 16 as electrically connecting the metal vias 28 to the metal regions 42, in order to electrically interconnect the micromachine 14 to the circuit board 38. Though not shown in FIG. 4, the bond pads or FIGS. 2 and 3 may also be present on the exposed (lefthand) surface of the capping chip 16. so that the device 10 can be mounted in either manner shown in FIGS. 3 and 4. FIG. 4 also shows an optional plate 48 attached to the device chip 12 and joined with solder 50 to the circuit board 38 to provide greater stability for the device 10. The plate 48 can be formed of any suitable, preferably nonconducting material, and may attached to the device chip 12 by gluing, solder or other suitable methods.

Figure 5:
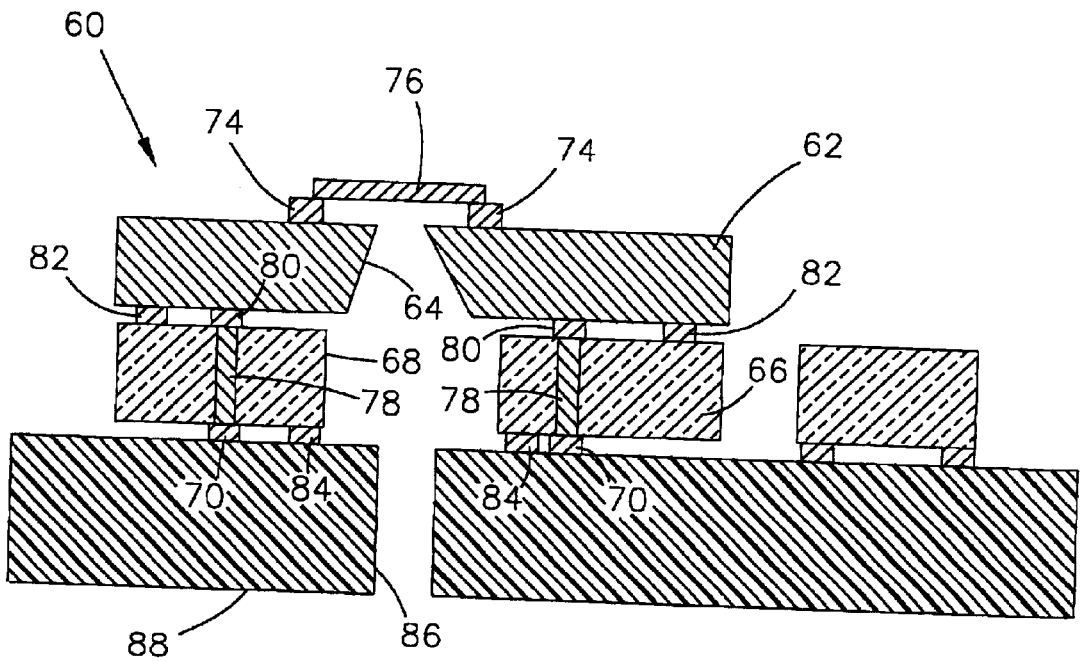
FIGS. 5 and 6 are cross-sectional views of wafer-bonded semiconductor micromachine devices in accordance with second and third embodiments of the present invention.
Figure 6:
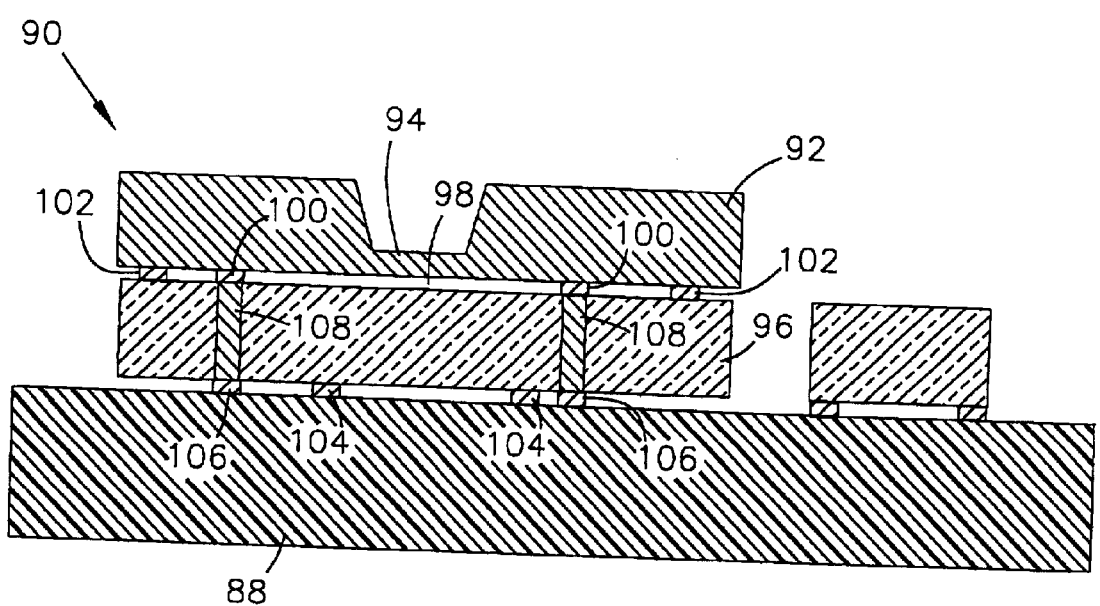

FIGS. 5 and 6 illustrate other sensing applications for a semiconductor micromachine device in accordance with this invention. In FIG. 5, a fluid-handling actuator 60 is shown mounted to a circuit board 88 in which an opening 86 has been formed through which a fluid passes before entering the actuator 60. As shown, the actuator 60 is structured similarly to the sensing device 10 of FIGS. 2 through 4, including device and capping chips 62 and 66, a solder seal ring 82 attaching the device chip 62 to the capping chip 66, metal vias 78 through the capping chip 66, and solder connections 70 and 80 by which the actuator 60 and its sensing elements are electrically interconnected with circuitry on the circuit board 88. As with the previous embodiments, the solder connections 70 and 80 are originally in the form of solder bumps, enabling reflow soldering of the device chip 12 to the capping chip 16, and enabling the device 60 to be "flip-chip" mounted to the circuit board 88. In addition, the capping chip 66 is shown as being attached to the circuit board 88 with a second solder seal ring 84 that isolates the solder connections 70 and circuitry on the circuit board 88 from the fluid flowing through the actuator 60.

The actuator 60 differs primarily from the sensing device 10 of FIGS. 2 through 4 by the presence of passages 64 and 68 formed in the device and capping chips 62 and 66, respectively, which permit fluid flow to actuator elements 74 and 76 formed or attached to the device chip 62. Suitable applications for the actuator 60 include but are not limited to ink jet printing, medical and chemical fluid analysis, and gas sensing.

Finally, FIG. 6 depicts an absolute pressure sensor 90 in accordance with this invention, by which a capping chip 96 is used to surface-mount a device chip 92 to a substrate, shown as the circuit board 88 of FIG. 5. The device chip 92 is shown to have a thinned section that defines a diaphragm 94 for sensing pressure to which the thinned section is subjected. A solder seal ring 102 attaches the device chip 92 to the capping chip 96, and defines a chamber 98 between the chips 92 and 96 that is evacuated during solder bonding and thereafter hermetically sealed under vacuum by the ring 102, as required for sensing absolute pressure. As with the previous sensing devices of FIGS. 2–5, the sensor 90 is equipped with metal vias 108 through the capping chip 96 and solder connections 100 and 106 by which the sensor 90 and its associated sensing elements (not shown) are electrically interconnected with circuitry on the circuit board 88. Signal conditioning circuitry for the sensing elements can be formed on the device chip 12 or a separate chip on the board 88. The sensing elements can be of any suitable type, including capacitive and piezoresistive sensing elements of types known in the art. As with the actuator 60 of FIG. 5, the capping chip 96 is shown as being attached to the circuit board 88 with the solder connections 106 and a second solder seal ring 104, the latter of which can be used to form an evacuated or otherwise protected region on the capping chip 96 in or on which circuits (not shown) can be formed. While described as sensing pressure, the diaphragm 94 can be equipped with heat sensing elements to provide a thermal sensing capability for such applications as bolometers and other temperature sensors, thermopiles and IR sensors.

Each of the semiconductor devices described above share the features of having a micromachine element and the ability to be manufactured and surface mounted to a circuit board without the additional steps of wire and adhesive bonding, without the use of a chip whose sole purpose is to enclose the micromachine, and without conventional sub-packages or cavity packages for protecting the micromachine. Devices in accordance with the present invention achieve these advantages by employing a capping chip that not only provides support and protection for its device chip and micromachine, but also provides electrical interconnects that enable the device chip to be directly surface mounted (i.e., solder bonded, preferably flip-chip mounted) to a substrate without the requirement for additional packaging or bonding steps. The features of this invention are applicable to a variety of semiconductor micromachine applications in addition to those described above, and can be achieved with devices that differ in appearance from those shown in the Figures.

Additional advantages of this invention include the ability to stack sensing devices so that multiple devices are mounted to a substrate with a single solder-bonding operation. Another option is to enlarge the capping chip so that discrete components, such as capacitors, inductors and resistors, can be simultaneously solder-bonded to the capping chip with the device chip, or subsequently wire-bonded to the capping chip. An organic coating or soldered metal cap may be used to encapsulate or enclose the components on the capping wafer, to permit handling as a single surface-mount package.

While the invention has been described in terms of a preferred embodiment, it is apparent that other forms could be adopted by one skilled in the art. Accordingly, the scope of the invention is to be limited only by the following claims.

What is claimed is:

1. A semiconductor device comprising:
   a device chip with a micromachine and at least one electrically-conductive runner to the micromachine;
   a capping chip enclosing the micromachine on the device chip, the capping chip having a first surface facing the device chip, an oppositely-disposed second surface, and at least one electrical interconnect comprising a conductive via that extends through the capping chip from the first surface to the second surface, tile electrical interconnect electrically communicating with the runner on the device chip;
   solder that has been reflowed to electrically connect the conductive via of the capping chip with the runner of the device chip;
   a bond pad on the capping chip and electrically communicating with the electrical interconnect through the capping chip; and
   solder on the bond pad of tile capping chip, the solder bonding the semiconductor device to a circuit board so that the capping chip is between the device chip and the circuit board.

2. A semiconductor device according to claim 1, wherein the capping chip is bonded to the device chip by solder.

3. A semiconductor device according to claim 1, further comprising a solder ring bonding the semiconductor device to the circuit board, wherein the solder on the bond pad of the capping chip is outside the solder ring at the second surface of the capping chip.

4. A semiconductor device according to claim 1, wherein the capping chip is bonded to the device chip by solder having a liquidus temperature, the semiconductor device further comprising a solder bump on the bond pad of the capping chip, the solder bump being formed of a solder alloy with a liquidus temperature that is lower than the liquidus temperature of the solder bonding the capping chip to the device chip.

5. A semiconductor device according to claim 2, wherein the solder is configured as a ring that completely surrounds the micromachine at the first surface of the capping chip.

6. A semiconductor device according to claim 5, wherein the micromachine is hermetically sealed with the ring between the device and capping chips.

7. A semiconductor device according to claim 5, wherein the conductive via is surrounded by the solder ring at the first surface of the capping chip.

8. A semiconductor device comprising:
- a device chip with a micromachine and electrically-conductive runners to the micromachine;
- a capping chip encloseing the micromachine on the device chip, the capping chip having a first surface facing the device chip and an oppositely-disposed second surface;
- conductive vias extending through the capping chip from the first surface to the second surface;
- solder bonding the capping chip to the device chip, the solder being formed of a solder alloy with a liquidus temperature;
- first solder bumps electrically connecting the conductive vias to the runners of the device chip, the first solder bumps being formed of a solder alloy with a liquidus temperature;
- bond pads on the capping chip and electrically connected to the conductive vias; and
- second solder bumps on the bond pads of the capping chip the second solder bumps being formed of a solder alloy with a liquidus temperature that is lower than the liquidus temperature of the first solder bumps and lower than the liquidus temperature of the solder bonding the capping chip to the device chip.

9. semiconductor device according to claim 8, wherein the solder bonding the capping chip to the device chip is configured as a ring that completely surrounds the micromachine at the first surface of the capping chip.

10. A semiconductor device according to claim 8, wherein the second solder bumps bond the semiconductor device to a circuit board so that the capping chip is between the device chip and the circuit board.

11. A semiconductor device according to claim 8, further comprising a metal region on a side of the capping chip between the first and second surfaces of the capping chip, the semiconductor device being bonded to a circuit board so that the metal region is between the capping chip and the circuit board.

12. A semiconductor device according to claim 11, wherein the metal region is electrically connected to at least one of the conductive vias, the device further comprising solder bonding the metal region of the capping chip to the circuit board.

13. A semiconductor device according to claim 11, further comprising a plate attached to tile device chip such that the device chip is between the capping chip and the plate.

14. A semiconductor deice according to claim 13, wherein the metal region is electrically connected to at least one of the conductive vias, the device further comprising solder bonding the metal region and the plate to the circuit board.

15. A semiconductor device according to claim 9, wherein the micromachine is hermetically sealed with the ring between the device and capping chips.

16. A semiconductor device according to claim 9, wherein the conductive vias are surrounded by the ring at the first surface of the capping chip.

17. A semiconductor device according to claim 9, wherein the conductive vias arc outside the ring at the first surface of the capping chip.

18. A semiconductor device comprising:
- a device chip with a micromachine and at least one electrically-conductive runner to the micromachine;
- a capping chip enclosing the micromachine on the device chip, the capping chip having a first surface facing the device chip, an oppositely-disposed second surface, and at least one electrical interconnect through the capping chip between the first and second surfaces, the electrical interconnect electrically communicating with the runner on the device chip;
- a bond pad on the capping chip and electrically communicating with the electrical interconnect through the capping chip; and
- a metal region on a side of the capping chip between the first and second surfaces of the capping chip, the semiconductor device being bonded to a circuit board so that the metal region is between the capping chip and the circuit board.

19. A semiconductor device according to claim 18, wherein the metal region electrically communicate with the electrical interconnect, the device further comprising solder bonding the metal region to the circuit board.

20. A semiconductor device according to claim 18, further comprising a plate attached to the device chip such that the device chip is between the capping chip and the plate.

21. A semiconductor device according to claim 20, wherein the metal region electrically communicates with the electrical interconnect, the device further comprising solder bonding the metal region and the plate to the circuit board.

22. A semiconductor device comprising:
- a device chip with a micromachine and electrically-conductive runners to the micromachine;
- a capping chip enclosing the micromachine on the device chip, the capping chip having a first surface facing the device chip and an oppositely-disposed second surface;
- conductive vias through the capping chip between the first and second surfaces;
- solder bonding the capping chip to the device chip, the solder being formed of a solder alloy with a liquidus temperature;
- first solder bumps electrically connecting the conductive vias to the runners of the device chip, the first solder bumps being formed of a solder alloy with a liquidus temperature;
- bond pads on the capping chip and electrically connected to tile conductive vias;
- second solder bumps on the bond pads of the capping chip, the second solder bumps being formed of a solder alloy with a liquidus temperature that is lower than the liquidus temperature of the first solder bumps and lower than the liquidus temperature of the solder bonding the capping chip to the device chip; and
- a metal region on a side of the capping chip between the first and second surfaces of the capping chip, the semiconductor device being bonded to a circuit board so that the metal region is between the capping chip and the circuit board.

23. A semiconductor device according to claim 22, within the metal region is electrically connected to at least one of the conductive vias, the device further comprising solder bonding the metal region of the capping chip to the circuit board.

24. A semiconductor device according to claim 22, further comprising a plate attached to the device chip such that the device chip is between the capping chip and tile plate.

25. A semiconductor device according to claim 24, wherein the metal region is electrically connected to at least one of the conductive vias, the device further comprising solder bonding the metal region and the plate to the circuit board.

* * * * *